United States Patent [19]
Hauer et al.

[11] Patent Number: 5,696,862
[45] Date of Patent: Dec. 9, 1997

[54] OPTICAL TRANSMITTING AND RECEIVING DEVICE HAVING A SURFACE-EMITTING LASER

[75] Inventors: Heiner Hauer, Fellbach; Albrecht Kuke, Auenwald; Bernhard Schwaderer, Weissach im Tal, all of Germany

[73] Assignee: Robert Bosch GmbH, Stuttgart, Germany

[21] Appl. No.: 540,648

[22] Filed: Oct. 11, 1995

[30] Foreign Application Priority Data

Nov. 17, 1994 [DE] Germany ............... 44 40 976.1

[51] Int. Cl.[6] .................................................. G02B 6/36
[52] U.S. Cl. ........................... 385/88; 385/89; 385/14
[58] Field of Search ............................. 385/88–94, 14, 385/49

[56] References Cited

U.S. PATENT DOCUMENTS

| | | | |
|---|---|---|---|
| 4,169,001 | 9/1979 | Kaiser | 385/131 |
| 5,394,490 | 2/1995 | Kato et al. | 385/14 |
| 5,479,540 | 12/1995 | Boudreau et al. | 385/14 |

FOREIGN PATENT DOCUMENTS

| | | |
|---|---|---|
| 3914835 | 7/1990 | Germany. |
| 4313493 | 5/1994 | Germany. |
| 9309456 | 5/1993 | WIPO. |
| 9314514 | 7/1993 | WIPO. |

*Primary Examiner*—John Ngo
*Attorney, Agent, or Firm*—Michael J. Striker

[57] ABSTRACT

In the case of the above devices, accurate adjustment is very important; the devices ought, however, to be very compact. It is not sufficient to utilize the silicon etching technique for accuracy. The optical transmitting element (LD) is located on a first holder (T1), and the optical receiving element (PD) and the transmission fiber (Fa) are located on a third holder. Provided there between is a second holder (T2) which is transparent to the wavelength of the light emitted by the transmitting element (LD). The holders are structured by means of anisotropic etching in order to render it possible to receive the individual components. Furthermore, the holders lie flat on one another and can be so adjusted. A monitor diode (MD) is provided.

14 Claims, 5 Drawing Sheets

OPTICAL TRANSMITTING AND RECEIVING DEVICE HAVING A SURFACE-EMITTING LASER

DESCRIPTION

The invention relates to an optical transmitting and receiving device having a surface-emitting laser according to the preamble of patent claim 1.

In an optical transmitting and receiving device, a transmission fiber has to be coupled to a transmitting element, usually a laser diode, and to a photodiode as receiving element. The transmitted and received signals are transmitted in opposite directions simultaneously in the transmission fiber. The transmitted and received signals are separated by a beam splitter in the case of the same wavelength, and by a wavelength-selective coupler in the case of different wavelengths. In order to obtain coupling losses which are as low as possible, the fiber must be coupled optimally both to the laser diode and to the receiving diode. In order to a couple a laser, having a horizontally situated resonator and light-emitting surface on the end face, to a monomode fiber, it is necessary because of the different beam characteristics of the two to carry out a beam transformation. Use is generally made for this purpose of imaging using one or two lenses. In accordance with the ratio of the mode field diameter of laser and fiber, the required enlargement ratio M is at approximately three to five. In a more recent laser diode type, the vertical cavity surface emitting laser (VCSEL), the resonator cavity and the direction of emission are perpendicular to the chip surface. The mode field diameter is matched to the mode field diameter of a monomode fiber, in order to achieve good coupling. The enlargement ratio is M=1 in this case. In a VCSEL, tolerances in the position of the laser are of the same order of magnitude as the tolerances of a fiber/fiber coupling.

Even more than end-emitting lasers, vertical cavity surface emitting lasers (VCSELs) are very sensitive to retroreflections at external reflecting surfaces into the laser resonator. A very critical reflecting surface would be a fiber end face which was fitted directly in front of the emitting aperture of the laser, such as would be necessary to achieve a good coupling efficiency. If a VCSEL is to be used in a transceiver module, an element for directional separation must be inserted between the transmission fiber and the laser. For reasons of space, this element cannot be mounted between laser and fiber in the case of end-fire coupling.

DE 39 14 835 C1 discloses an arrangement for coupling an optical fiber to an optical transmitting or receiving element.

An adjustment in the plane which is lateral relative to the optical axis is achieved when the optical fiber and optical transmitting or receiving element are fixed on different holders which lie displaceably on one another with their support surfaces, and when the light bundle passes from the optical fiber to the optically active element, or vice versa, by the means of two-fold reflection at a reflecting plane located on a holder, in each case. A lateral adjustment is carried out by displacing the holders. The holder, which supports the transmitting or receiving element, can consist of a substrate and a part applied thereon which has a continuous opening through which the light beam passes. It is possible to apply the arrangement in all transmission systems having optical fibers, and in duplexers having light launching and light extraction. For the case of coupling to a transmitting element, in particular to an edge-emitting laser, a receiving element can be provided on the holder with the fiber.

Starting from this prior art, the object of the invention is to specify an optical transmitting and receiving device in which the outlay on adjustment is reduced and the assembly is simplified.

The object is achieved by means of an invention having the features of patent claims 1 and 2. Advantageous developments are specified in the subclaims.

A solution is proposed in which adjustment-free assembly of all the components of a transceiver module with VCSEL is possible, and coupling is performed without harmful retroreflection onto the laser. Moreover, proposals are made for low-reflection coupling of a monitor diode for controlling the optical power. The holding structures required in this case can be produced cost effectively in large numbers micromechanically.

Exemplary embodiments of the invention are described with the aid of the drawings, in which.

Figure 1:
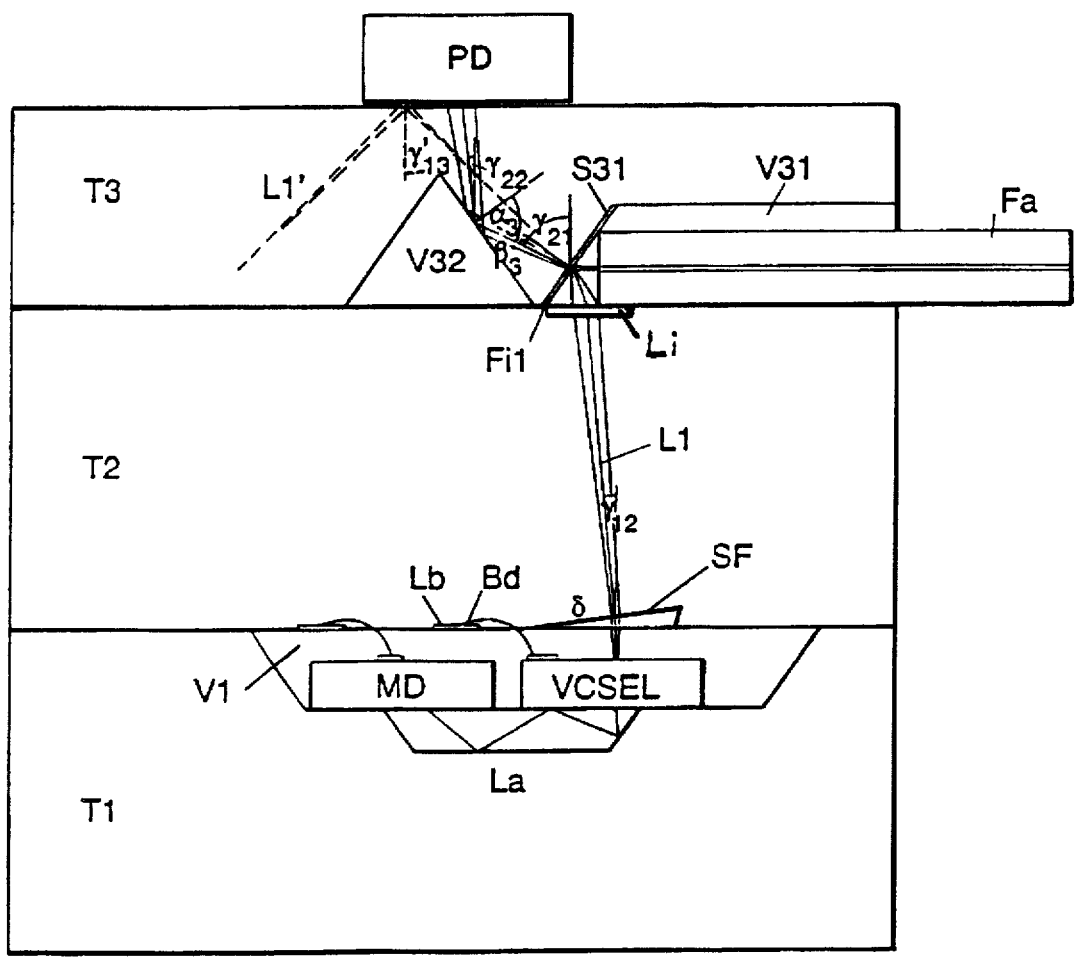
FIG. 1 shows a section through an arrangement according to the invention having a monitor diode on the holder of the laser diode.
Figure 1A:
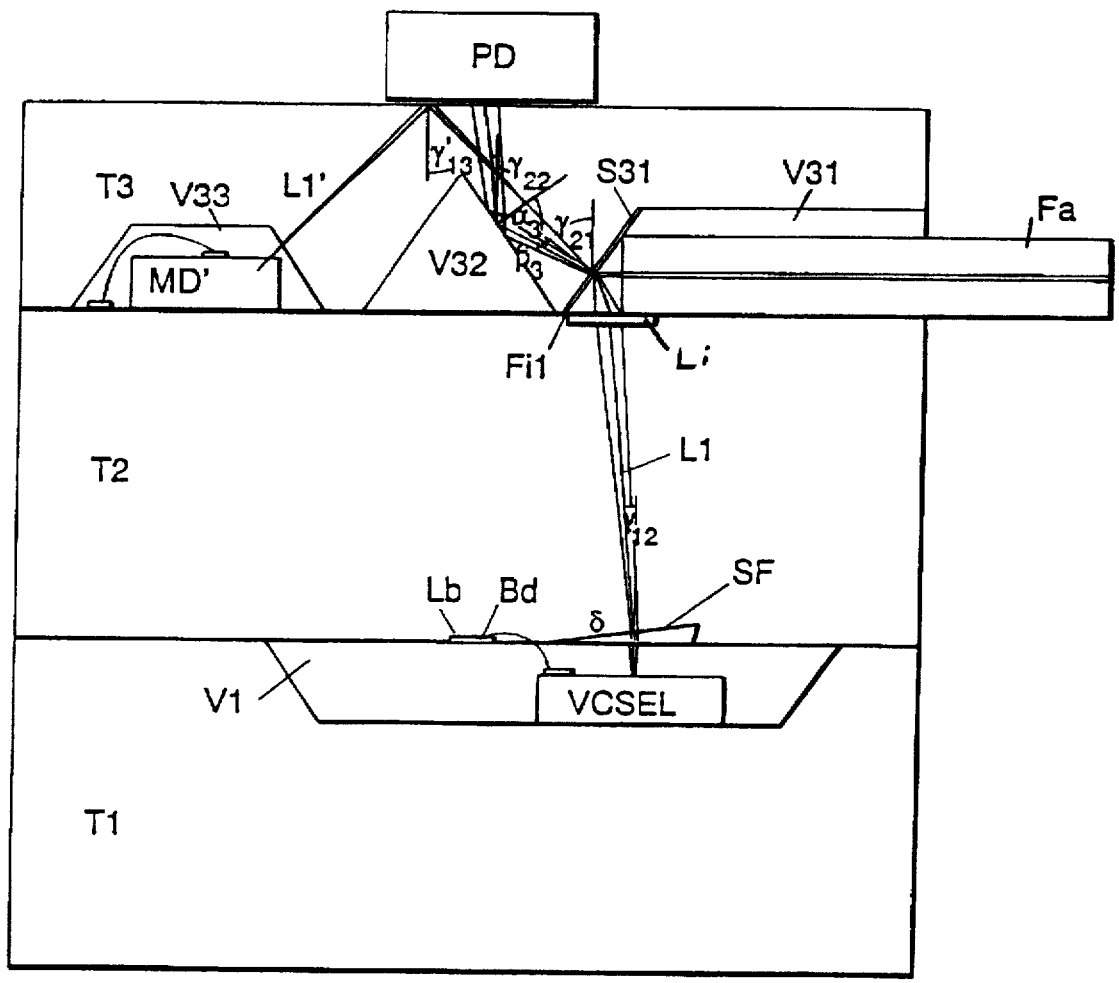
FIG. 1a shows a section through an arrangement according to the invention having a monitor diode on the holder of the transmission fiber.

A first exemplary embodiment of the solution according to the invention is represented in FIG. 1. A depression V1, which has a flat bottom B1 on which a vertically emitting laser diode VCSEL is mounted, is produced by anisotropic etching in a first holder T1, which consists of monocrystalline silicon. As a consequence of the anisotropic etching process, the side faces of the depression have a slope angle of $\alpha = \arctan(\sqrt{2}) = 54.7°$. In order to facilitate the positioning, during assembly the laser diode is aligned with the base lines of at least two mutually perpendicular side faces.

Mounted above the holder T1 is a second holder T2, which is transparent to the wavelength $\lambda_1$ of the laser light. This second holder can, for example, likewise consist of silicon. However, a different transparent material which can be structured micromechanically is also possible. Structured on the underside of the holder T2 in the region above the active surface of the VCSEL is an inclined surface SF whose slope angle $\delta$ relative to the underside of the holder T2 is so large that the transmitted light bundle L1, exiting vertically from the VCSEL, is refracted at an angle of $\gamma_{12}$ at the inclined boundary surface SF. A lens Li is mounted on the surface of the holder T2. This lens can advantageously be a Fresnel lens applied in a planar fashion or a holographic lens. However, other types of lens are also possible, such as a ball lens, for example, which is seated in a micromechanically formed depression, or a lens produced by dry etching. The lens L1 converts the initially divergent light bundle L1 into a convergent bundle. As a consequence of the refraction of light at the upper boundary surface of the holder T2, the central beam of the light bundle is refracted at an angle of $$\delta_{11} = \arcsin((n_2/n_0)\ast\sin(\gamma_{12})),$$

$n_0$ being the refractive index in the exterior space and $n_2$ the refractive index in the holder T2.

Mounted above the holder T2 is a further holder T3 which, like the holder T1, likewise consists of monocrystalline silicon. Two depressions V31 and V32 are anisotropically etched in this holder T3. The depression V31 is a V-groove for accepting the transmission fiber Fa. The width of this V-groove is expediently so large in this case that the lower most sheathing line of the fiber comes to lie precisely in the plane of the underside of T3. The end face S3 of the V-groove is coated with a wavelength-selective filter Fi1. This filter is designed such that the transmission wavelength $\lambda_1$ is reflected and the reception wavelength $\lambda_2$ is passed. The transmitted light bundle L1 is then reflected in a horizontal direction at the end face S31, inclined at an angle of $\alpha$, and launched into the transmission fiber Fa, when the angle $\gamma_{11}$ obeys the following relationship:

$$\gamma_{11}=2*\alpha-90°=19.5°$$

From this, the angle $\gamma_{12}$ is calculated at 5.5°, when 3.4777 ($\lambda=1550$ nm) is used as the refractive index of silicon for the holder T2. The slope angle $\delta$, which is required for the purpose of producing the angle $\gamma_{11}=5.5°$ at the boundary surface SF, is calculated from the transcendent equation $$(n_2/n_0)*\sin(\delta-\gamma_{11})-\sin\delta=0$$

Using the values specified above for $n_2$, $n_0$ and $\gamma_{11}$, iteration produces a slope angle of $\delta=8.71°$.

Instead of being produced by refraction at the inclined surface, the angle $\gamma_{12}$ required for the correct light conduction can also be achieved by other means. For example, it is possible to apply to the surface of the VCSEL a refractive or diffractive deflection element such as, for example, a Fresnel element or a hologram, which deflects the direction of the light by the angle of $\gamma_{11}$, so that the angle of $\gamma_{12}$ is achieved by refraction at the underside of the holder T2 in the holder T2. A further possibility consists in mounting the VCSEL chip itself inclined at the angle of $\gamma_{11}$. This can be performed by inclining the bottom of the depression V1.

Since the mode field diameter of VCSEL and fiber are of approximately the same size, the lens Li must be designed so as to produce a 1:1 imaging with M=1. Any differences in the mode field diameters can easily be compensated by matching the scale ratio. For an enlargement ratio of M=1, there is also a need for the optical path lengths to be of the same size for the object distance and image distance. The refractive index of the material traversed must be taken into account in each case for calculating the optical path lengths. The object distance can be matched to the image distance in the space upstream of the fiber Fa by selecting the thickness of the holder 2. Since the coupling tolerances of a VCSEL are of the order of magnitude of the fiber coupling tolerances, active adjustment can be dispensed with here. The coupling tolerances are approximately 2–3 µm in the lateral direction for fiber and VCSEL. In the axial direction, they are approximately 30 µm. These tolerances are to be satisfied by means of micromechanically structured silicon holding structures, so that adjustment-free assembly is possible. Micromechanically produced stops or depressions Va, into which adjusting members JK are laid, are used for the adjustment-free assembly of the three holders T1–T3 on one another.

The received light bundle L2 exiting from the transmission fiber and having the wavelength $\lambda_2$ penetrates the filter Fi1 and is diffracted into the silicon at the boundary with the silicon at an angle of $$\gamma_{21}=\alpha+\beta_3$$

with respect to the surface normal of the substrate surface of T3, $\beta_3$ being the refracting angle at the end face S31, where $$\beta_3=\arcsin((n_0/n_3)*\sin(90°-\alpha)).$$

In this case, $n_0$ is the refractive index in the V-groove V31, and $n_3=3.4777$ is the refractive index in the silicon holder T3. With $n_0=1$ for air, the result is $\beta_3=9.6°$ and $\gamma_{21}=64.3°$. The light bundle L2 impinges on the side face S31 of the depression V31 at an angle of incidents of $$\alpha_3=180°-2*\alpha-\beta_3=61.0°.$$

Since this angle $\alpha_3$ is greater than the critical angle of total reflection of the silicon/air transition, namely $$\alpha_g=\arcsin(n_0/n_3)=16.7°$$

the light bundle L2 is refracted at an angle of $$\gamma_{22}=\alpha_3-\alpha=6.3°$$

with respect to the surface normal of the holder surface. The angle $\gamma_{22}$ is smaller than $\alpha_g$, with the result that the light bundle L2 can exit on the surface of the silicon holder T3. The receiving diode PD is mounted at the exit point of the light bundle L2. The position for the photodiode follows from the above named angles, the distance of two depressions V31 and V32 from one another and with a slight dependence on the thickness of the holder T3. By contrast, the position of the light emitting surface of L2 does not depend on the axial position of the fiber Fa in the V-groove V31. The position of the light emitting surface can therefore be identified relative to the micromechanically produced depressions V31 and V32 by marks or stops. These marks or stops can be aligned very precisely relative to the depressions V31 and V32 by means of a photolithographic technique.

In order to regulate the optical power of the transmitting laser, the laser power must be measured using a monitor diode MD. The monitor diode must also be coupled with low reflection in this case. According to the invention, a narrow V-groove Vm is etched anisotropically below the laser diode VCSEL. One end face Sm1 of this V-groove is situated in this case below the lower light emitting surface of the VCSEL and the other end face Sm2 is situated below the monitor diode MD mounted next to the VCSEL. The side walls of the monitor V-groove Vm are silvered so that the monitor signal passes into the monitor diode after a plurality of reflections.

A further advantage of the solution according to the invention resides in the fact that a very high near-end crosstalk attenuation can be achieved in this case. A high near-end crosstalk attenuation is required so that the signal transmitted from the laser does not, as a consequence of insufficient directional separation, enter the receiver diode, located in the vicinity of the transmitter, and disturb said diode during reception of weak useful signals. Filter layers generally have only a limited capability for separating different wavelengths. Consequently, a small proportion of the transmitted light bundle L1 will also penetrate the filter layer S31. The beam path of this parasitic light is represented with dashes as S1'. However, this light bundle impinges on the surface of the holder T3 at an angle of $$\gamma_{13}=\alpha-\beta_3=45.2°$$

with respect to the surface normal. This angle is, however, larger than the critical angle of the total reflection $\alpha_g=16.7°$, with the result that the direct parasitic light cannot pass from the transmitter into the receiving diode.

In a variant of the first exemplary embodiment, the filter Fi1 is designed such that a small proportion of the transmitted light still penetrates the filter, while the largest portion is reflected. This light bundle L1' penetrating the filter is used as feedback signal, according to the invention. The monitor diode MD' is then mounted not on the holder T1 but in a recess V33 on the holder T2. This is represented by dashes in FIG. 1.

Figure 2:
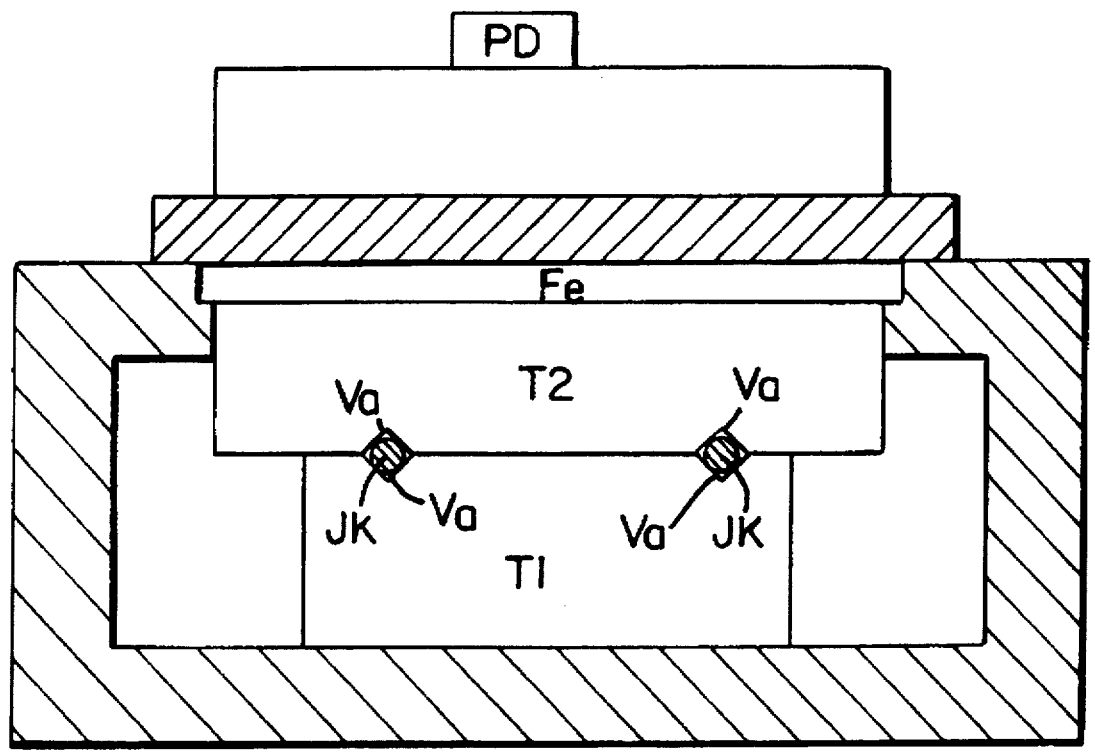
FIG. 2 shows the set up for adjusting the arrangement.

Because of the larger mode field of a VCSEL by comparison with an end-emitting laser, it is possible to dispense with active adjustment of the fiber in relation to the transmitted light bundle L1. The required accuracy in the range of 2–3 μm is achieved by means of adjusting members JK in depressions Va or by means of micro-mechanically produced stops in the opposite surfaces of the holders T1 to T3. The holder T2 can be used in this case as a light-transmitting, hermetically sealed cover of the housing G. It is likewise possible to use an additional hermetically sealed aperture Fe between the holders T2 and T3 (see FIG. 2).

Figure 3:
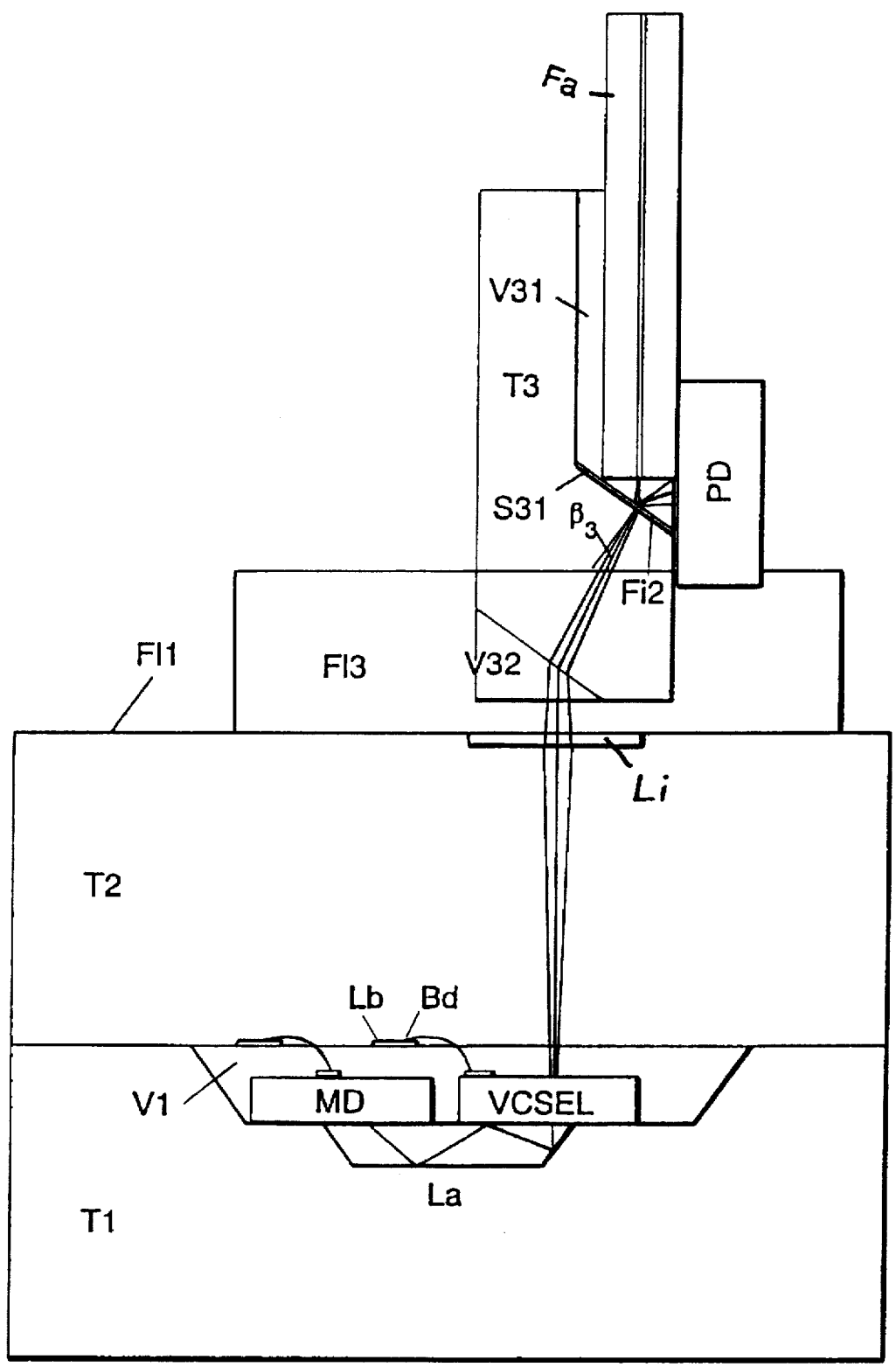
FIG. 3 shows an arrangement according to the invention, the third holder being aligned with its end face towards the first holder.

In a second exemplary embodiment of the solution according to the invention, the holder T3 is aligned relative to the holder T2 not with its underside but with its end face. The second exemplary embodiment according to the invention is represented in FIG. 3. The holders T1 and T2 are set up as in the first exemplary embodiment. Here, as well, the fiber Fa is again guided in a V-groove V31 in a holder T3, and can also be adjusted axially in this V-groove. The end face S31 is likewise coated with a wavelength-selective filter layer Fi2. By contrast with the filter layer Fi1 in the first exemplary embodiment, the filter layer Fi2 is transparent to the transmitting wavelength $\lambda_1$ and reflective for the received wavelength $\lambda_2$. The light bundle L1 exiting from the holder T2 at an angle of $\gamma_{11}=19.5°$ impinges on the side wall S31 of a depression V32 which is an anisotropically etched from the opposite side into the holder T3 and whose part opposite the side wall S32 is removed, for example, by sawing. Since the two side faces S32 and S31 are parallel to one another, the transmitted light bundle S1 is offset in parallel by the two-fold refraction and then enters into the transmission fiber Fa. By contrast with the first exemplary embodiment, the direction of the light beam in the holder T2 need not be inclined here by means of special measures, but can remain vertical. The holder T3 is then mounted at right angles to the surface normal of the holder T2. The receiving diode PD is mounted above the end face S31 of the fiber V-groove V31. In this exemplary embodiment, the received signal exiting from the fiber has only a very short optical path until impinging on the receiving diode. It therefore spreads out less, with the result that a photodiode of smaller area can be used.

Figure 4:
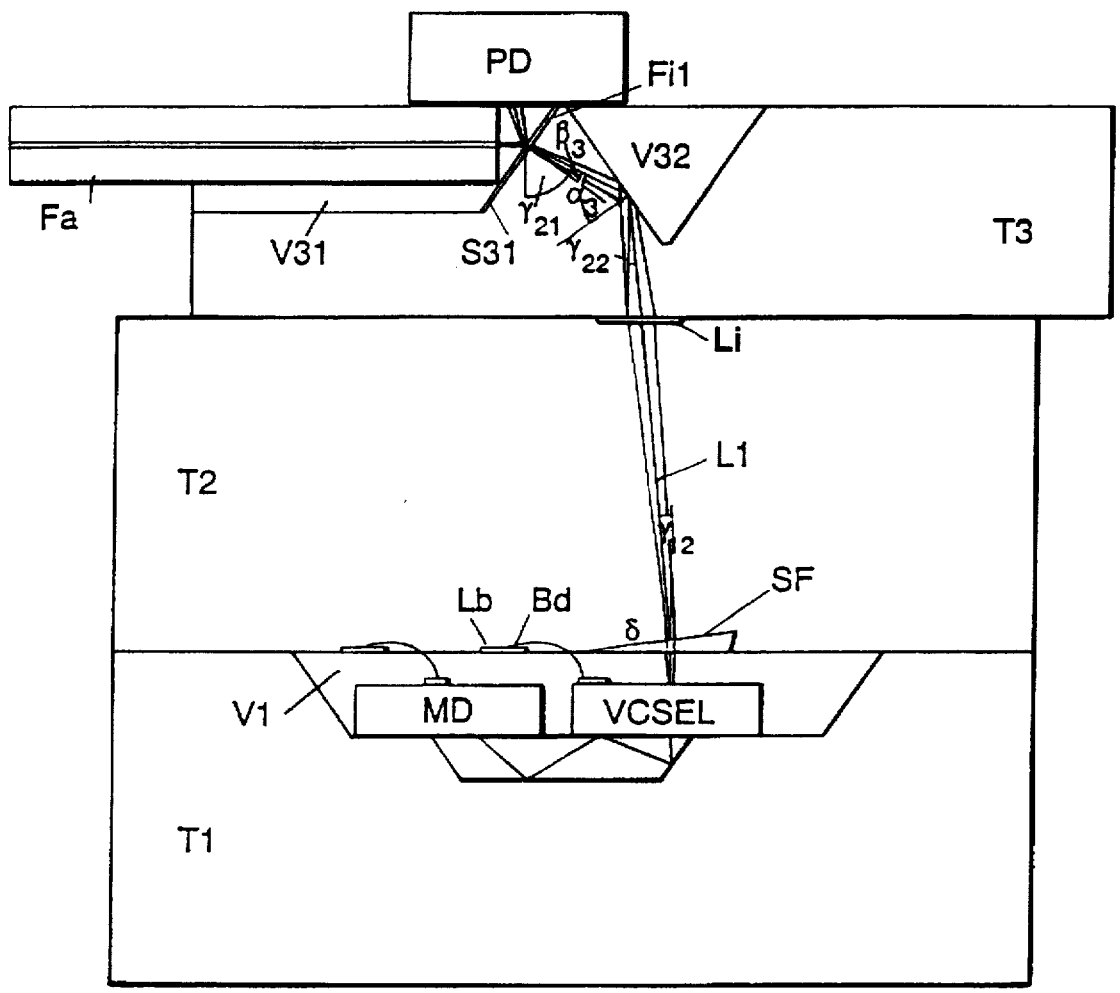
FIG. 4 shows an arrangement according to the invention, the third holder of which is vertically and horizontally reflected by comparison with the arrangement according to FIG. 1.

A third exemplary embodiment of the solution according to the invention is represented in FIG. 4. Here, the holder T3 is constructed in a fashion resembling the first exemplary embodiment but, by contrast with the first exemplary embodiment, mirrored vertically and horizontally. As in the exemplary embodiment 2, the filter layer Fi2 must be transparent to the transmitting wavelength and reflective for the received wavelength. As in the exemplary embodiment 2, the photodiode PD for the received signal is mounted in the region above of the end face of the V-groove V31. As in the exemplary embodiment 2, there is also the advantage here that the path between the fiber end face and photodiode is very short, and this entails a slight beam expansion, and therefore permits a photodiode of very small surface area which is suitable for high frequencies. The directional angle $\gamma_{12}$ of the beam in the holder T2 is 5.5° for silicon as holder material. By means of measures as described in the first exemplary embodiment, the directional angle $\gamma_{21}$ of the beam in the holder T3 is matched to this directional angle.

The optical path in the holder T3 for the transmitted light bundle, which is longer here by comparison with the first exemplary embodiment, must be compensated by means of appropriate thickness of the holder T2.

The holder T2 with the lens Li is produced in large numbers for many individual modules, and all the lenses are mounted in common with the lasers in a single adjusting and assembling process. Here, passive adjustment by means of marks or adjustment-free assembly by means of micromechanically structured stops is possible. The depressions V2 in the holder T2 are configured in this case such that the optoelectronic and electronic components such as the laser diode LD, the monitor diode MD or (not represented here) electronic modules for driving the laser are included in hermetically sealed fashion. After the holder substrates T1 and T2 have been connected to each other, the latter are separated by sawing or by breaking at micromechanically produced rupture lines. The position of the sawing or rupture lines is in this case such that the position of the depressions V1 and V2 and of the lenses Li are not affected.

The monitor diode MD can also be mounted on the underside or topside of the holders T2 or T3, it being necessary to provide corresponding cutouts in the respectively neighboring holder. A further lens Lim can be provided on the holder T2 for coupling the monitor diode.

We claim:

1. An optical transmitting and receiving device, comprising holding means including a first holder, a second holder and a third holder arranged so that said second holder is located between said first holder and said third holder, said holders having V-shaped grooves and depressions; a transmitting element fixed on said first holder; a receiving element and a transmission fiber fixed on said third holder, said third holder having at least one reflecting surface and being transparent to light having a wavelength of a light emitted by said transmitting element; a monitor diode mounted on a surface of said first holder in a recess of said second holder, said transmitting element being formed as a surface emitting laser diode, said second holder having a refractory active surface which is arranged relative to said transmitting element so that a beam impinges through said second holder on said reflecting surface of said third holder and then on said transmission fiber.

2. An optical transmitting and receiving device as defined in claim 1, wherein said transmission fiber has an optical axis which encloses an angle of 90° with a surface of said holders.

3. An optical transmitting and receiving device as defined in claim 1, wherein said second holder is provided with a bevel in a region of an entry of said beam from said transmitting element.

4. An optical transmitting and receiving device as defined in claim 1, wherein said transmitting element has an emitting surface provided with a hologram.

5. An optical transmitting and receiving device as defined in claim 1, wherein said transmitting element has an emitting surface provided with a Fresnel lens.

6. An optical transmitting and receiving device as defined in claim 1, wherein said transmitting element is mounted on one of said holders inclined with respect to a surface of said one holder.

7. An optical transmitting and receiving device as defined in claim 1, wherein said V-shaped grooves and depressions are anisotropically etched formations.

8. An optical transmitting and receiving device, comprising holding means including a first holder, a second holder, and a third holder arranged so that said second holder is located between said first holder and said third holder, said holders having V-shaped grooves and depressions; a transmitting element fixed on said first holder; a receiving element and a transmission fiber fixed on said third holder, said third holder having at least one reflecting surface and being transparent to light having a wavelength of a light emitted by said transmitting element; a monitor diode mounted a surface of said second holder in a recess of said third holder, said transmitting element being formed as a surface emitting laser diode, said second holder having a refractively active surface arranged relative to said transmitting element so that a beam impinges through said second holder no said reflecting surface and from there on said transmission fiber.

9. An optical transmitting and receiving device as defined in claim 8, wherein said transmission fiber has an optical axis which encloses an angle of 90° with a surface of said holders.

10. An optical transmitting and receiving device as defined in claim 8, wherein said second holder is provided with a bevel in a region of an entry of said beam from said transmitting element.

11. An optical transmitting and receiving device as defined in claim 8, wherein said transmitting element has an emitting surface provided with a hologram.

12. An optical transmitting and receiving device as defined in claim 8, wherein said transmitting element has an emitting surface provided with a Fresnel lens.

13. An optical transmitting and receiving device as defined in claim 8, wherein said transmitting element is mounted on one of said holders inclined with respect to a surface of said one holder.

14. An optical transmitting and receiving device as defined in claim 8, wherein said V-shaped grooves and depressions are anisotropically etched formations.

* * * * *